United States Patent
James

(10) Patent No.: US 6,512,370 B1
(45) Date of Patent: Jan. 28, 2003

(54) LOW POWER, FREQUENCY-MODE MAGNETOMETER

(75) Inventor: John James, Los Gatos, CA (US)

(73) Assignee: Elf Engineering, Ltd., Houston, TX (US)

( * ) Notice: Subject to any disclaimer, the term of this patent is extended or adjusted under 35 U.S.C. 154(b) by 0 days.

(21) Appl. No.: 09/248,793

(22) Filed: Feb. 12, 1999

(51) Int. Cl.$^7$ ................................................ G01R 33/04
(52) U.S. Cl. ............................ 324/253; 33/361; 331/65
(58) Field of Search ................................ 324/244, 258, 324/247, 249, 253, 254, 255, 260; 331/65; 33/361; 340/870.33

(56) References Cited

U.S. PATENT DOCUMENTS

| | | | |
|---|---|---|---|
| 4,305,034 A | 12/1981 | Long et al. | 324/253 |
| 4,733,181 A | 3/1988 | Bauer | 324/253 |
| 4,851,775 A | 7/1989 | Kim et al. | 324/247 |
| 4,859,944 A | 8/1989 | Webb | 324/253 |
| 5,015,953 A | 5/1991 | Ferguson et al. | 324/244 |
| 5,039,945 A | 8/1991 | Webb | 324/253 |
| 5,124,648 A | 6/1992 | Webb et al. | 324/253 |
| 5,239,264 A | 8/1993 | Hawks | 324/253 |
| 5,642,046 A | 6/1997 | Hawks | 324/253 |
| 5,744,956 A | 4/1998 | Hawks | 324/253 |
| 5,818,226 A | 10/1998 | Aizawa | 324/258 |

FOREIGN PATENT DOCUMENTS

| | | | | |
|---|---|---|---|---|
| EP | 0045509 A2 | * | 2/1982 | G01R/33/02 |
| SU | 945835 B | * | 7/1982 | G01R/33/02 |

OTHER PUBLICATIONS

EP 0045509, European Patent Application English Translation.*

* cited by examiner

Primary Examiner—Jay Patidar
(74) Attorney, Agent, or Firm—Edward S. Wright

(57) ABSTRACT

A low power, frequency-mode magnetometer. The magnetometer includes an LC oscillator, a bias resistor and a polarity switch. The LC oscillator produces an output signal having a variable frequency indicative of both a magnitude and a polarity of a magnetic field. The LC oscillator includes an inverting amplifier and a Pi network including an inductor and two capacitors. The inductor is realized as a coil wound about a high permeability, low hysteresis, core material that has been longitudinally cut. The inductor is coupled between an input node and an output node, as is the inverting amplifier. The inverting amplifier has a first trigger voltage and a second trigger voltage, which are symmetrically located with respect to one half of a DC bias voltage. The bias resistor is coupled between the input node of the LC oscillator and a first node and controls the DC bias current to the inductor. The polarity switch switches the first node between ground and the bias DC voltage.

18 Claims, 4 Drawing Sheets

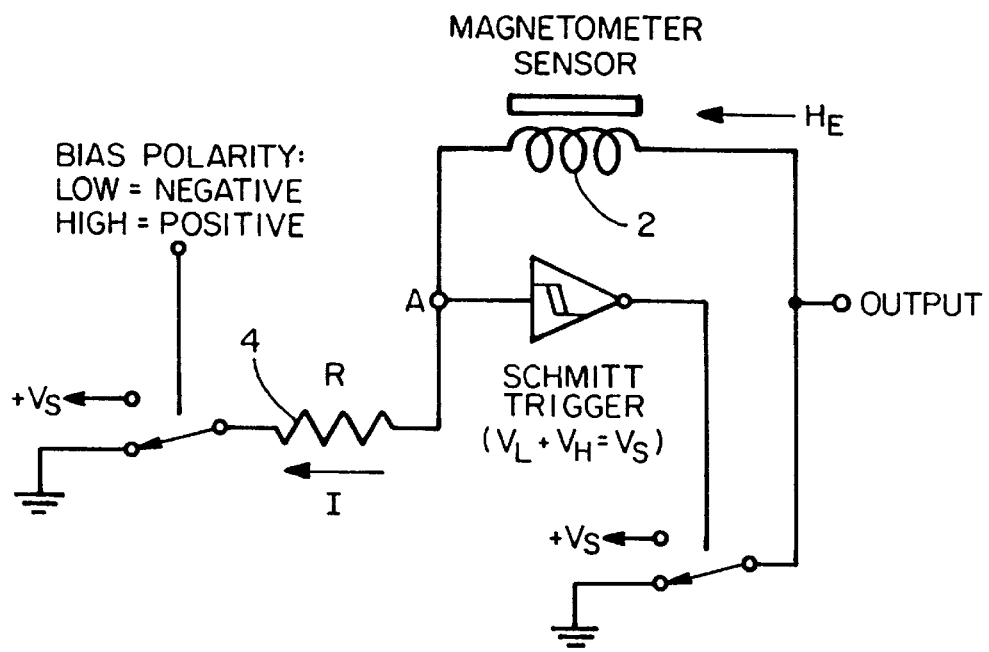
FIG_1
(PRIOR ART)
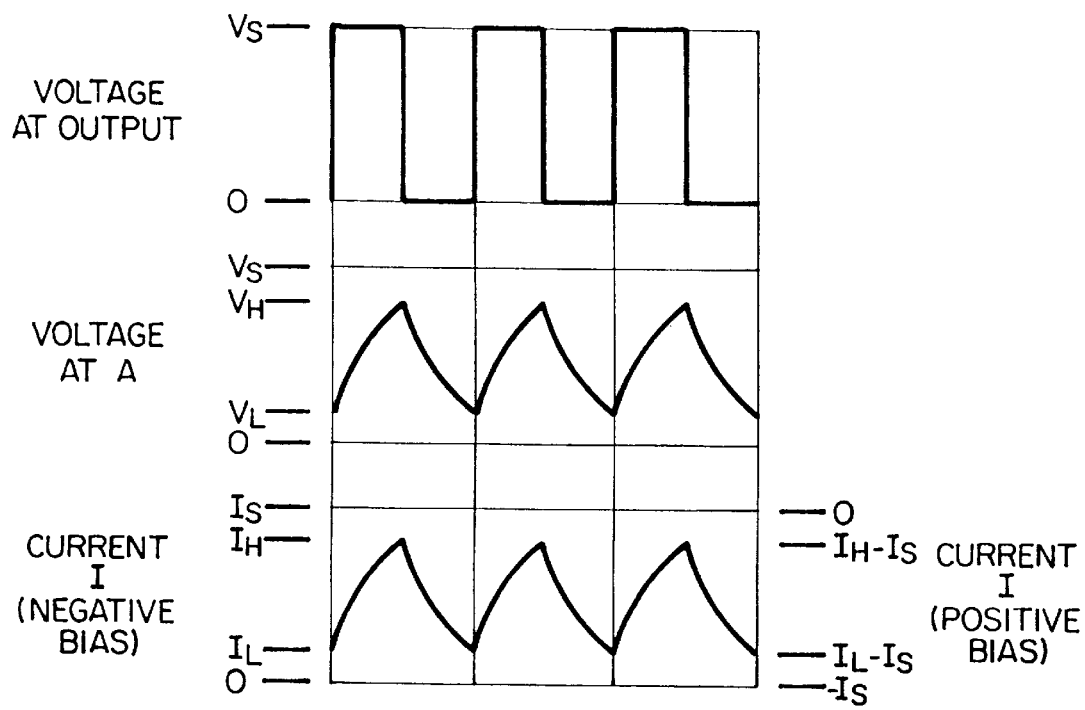
FIG_2
(PRIOR ART)

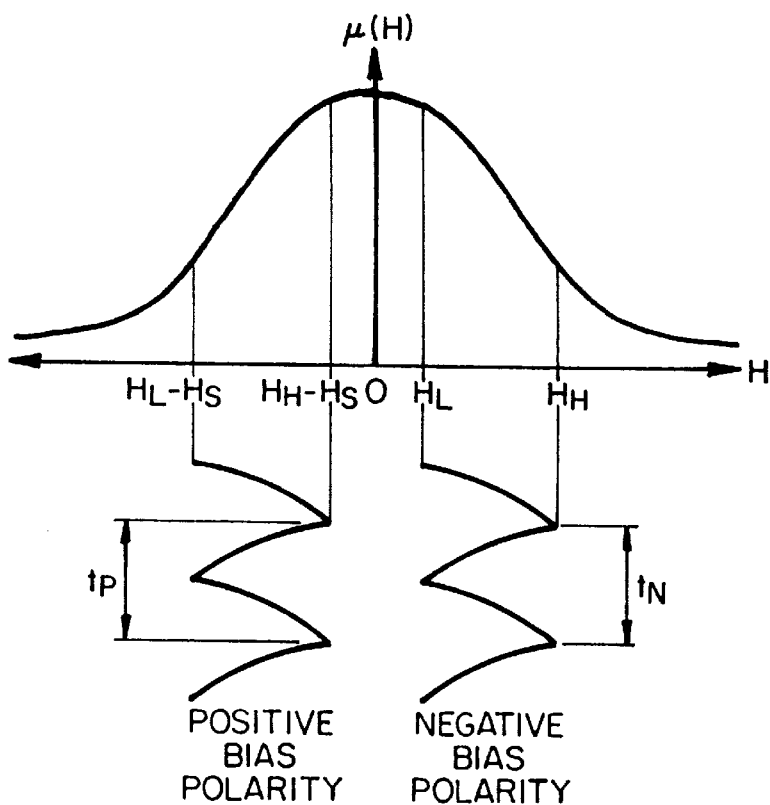
FIG_3
(PRIOR ART)
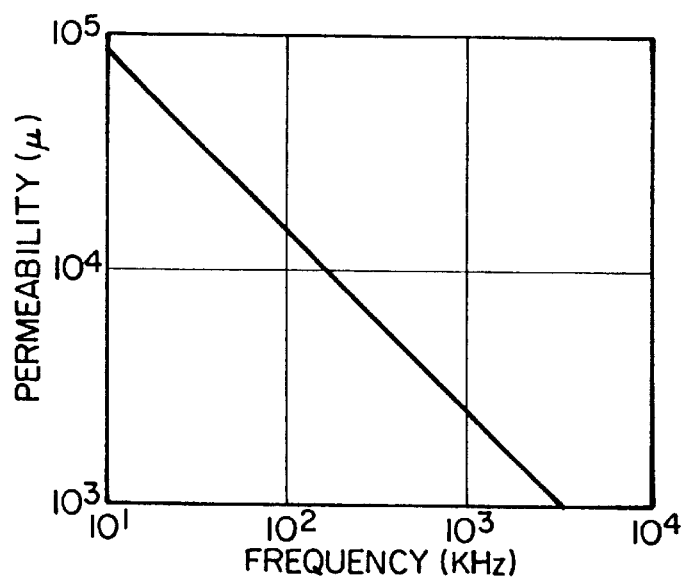
FIG_4
(PRIOR ART)

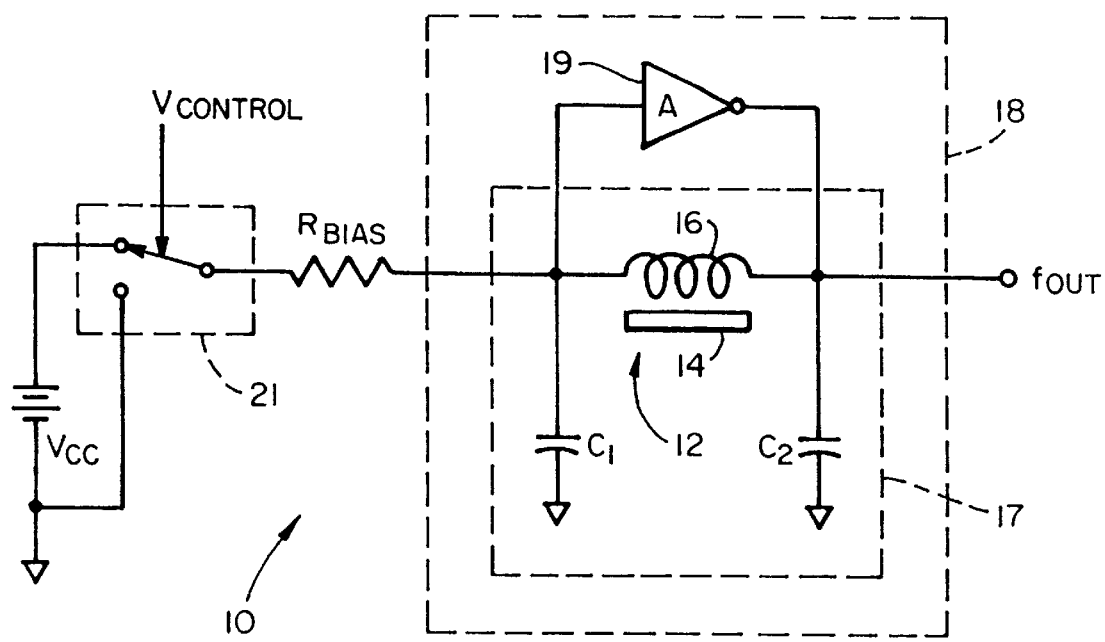
FIG_5
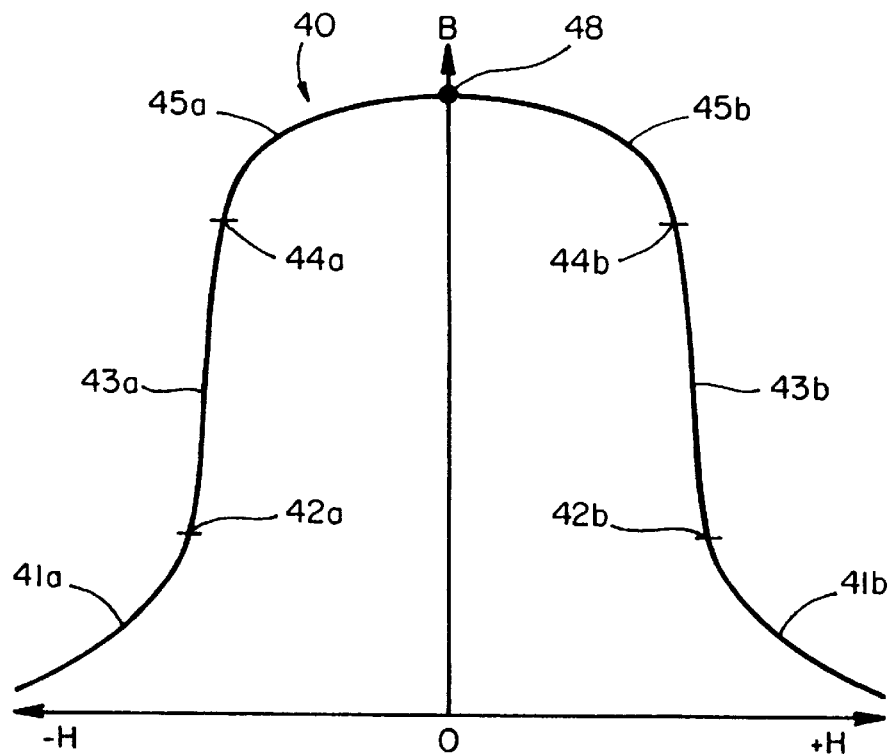
FIG_6

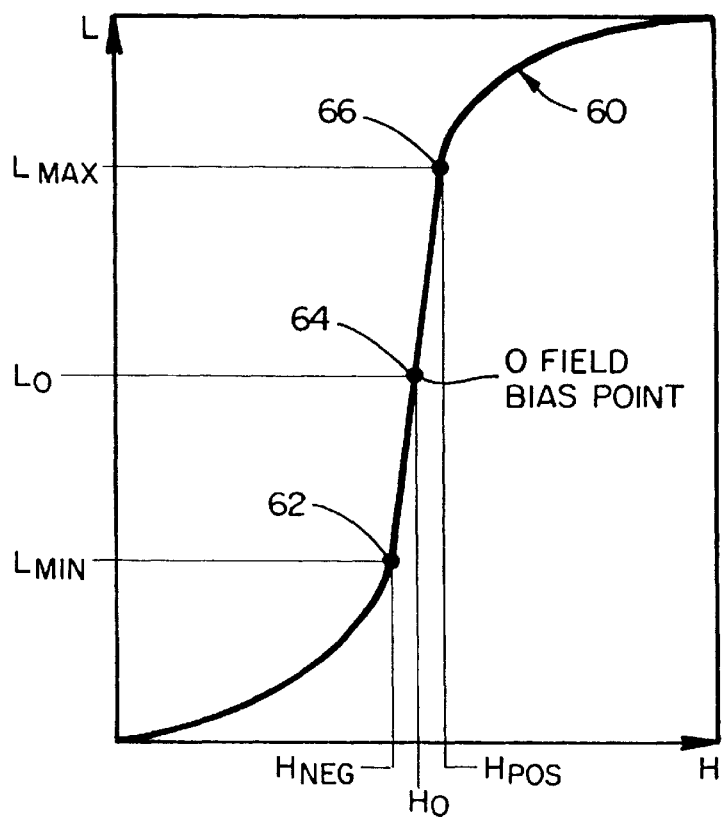
FIG_7
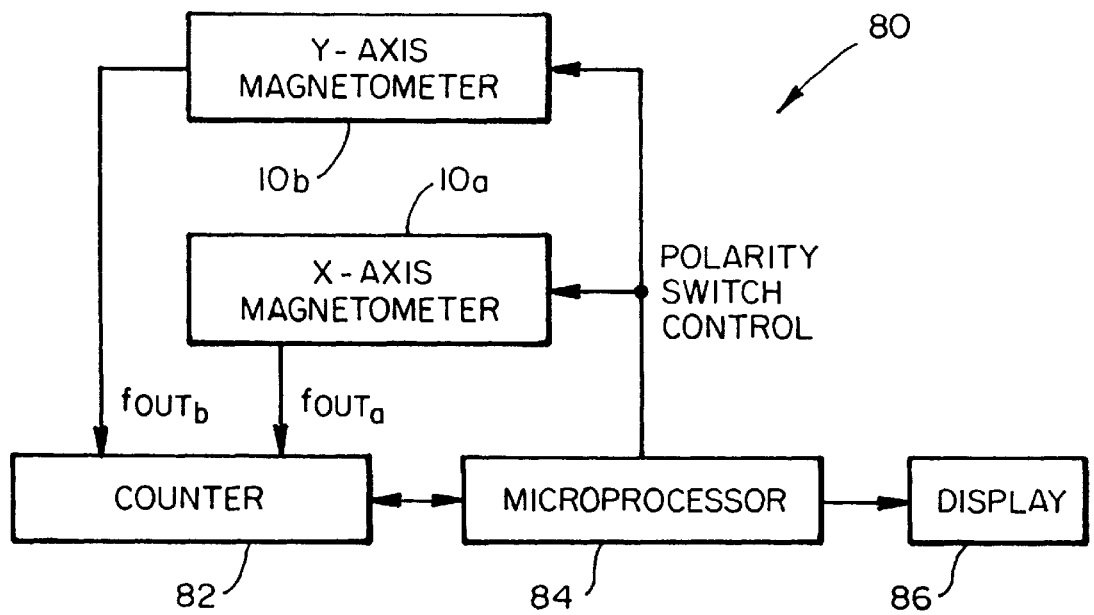
FIG_8

LOW POWER, FREQUENCY-MODE MAGNETOMETER

FIELD OF THE INVENTION

The present invention relates to a magnetometer. In particular, the present invention relates to a low power magnetometer that senses frequency differences to determine magnetic field strength.

BACKGROUND OF THE INVENTION

A magnetometer measures a magnetic field and produces a signal indicative of magnetic field intensity and/or polarity. Of the magnetometer types, fluxgate magnetometers are popularly used to measure weak static magnetic fields. Fluxgate magnetometers rely upon the saturation of a magnetic core to measure a magnetic field. A great deal of the power consumed by a fluxgate magnetometer arises from the need to saturate the sensor core to detect an external magnetic field.

Frequency-mode magnetometers indicate magnetic field intensity as a function of frequency differences in a sensed signal. Because they do not force the sensor's core into saturation, this type of magnetometer consumes less power than a fluxgate magnetometer. A frequency-mode magnetometer is disclosed in U.S. Pat. No. 5,239,264 to Hawks, "Zero-Offset Magnetometer Having Coil and Core Sensor Controlling the Period of an Oscillator Circuit", ("Hawks") which is incorporated herein by reference. FIG. 1 illustrates one embodiment of Hawks' magnetometer, which uses a relaxation, i.e. LR, oscillator. The magnetometer's sensor is a wire wound high permeability core 2. The total magnetic field sensed by the magnetic sensor is the sum of the externally applied magnetic field plus the magnetic field induced by the current in the coil. Hawks shows that the frequency of his relaxation oscillator will be a linear function of the externally applied magnetic field if a DC bias current is provided for the magnetometer's sensor. Without the DC bias current, Hawks' magnetometer would be unable to differentiate between two magnetic fields of the same magnitude, but of opposite directions. This is because of the symmetry of the permeability curve of FIG. 3. The Schmitt trigger of Hawks' magnetometer provides the necessary DC bias current. Consequently, on the left side of the permeability curve, increasing magnetic field strength increases permeability and thus, the sensed frequency. Whereas on the right side of the permeability curve, increasing magnetic field strength reduces permeability.

To obtain a zero-compensated reading from his magnetometer, Hawks operates on both sides of the permeability curve in a mirror-image fashion. This requires setting the level of the DC power supply, $V_s$, equal to the sum of the Schmitt trigger's high and low trip points, $V_H$ and $V_L$. In other words, $V_s = V_H + V_L$.

A switch, illustrated in FIG. 1, controls the polarity of bias current within Hawks' magnetometer. While the operation of the oscillator is nearly identical regardless of the input level, throwing the polarity switch changes the net current through the bias resistor 4. The differences between the current for negative and positive bias polarities are illustrated in FIG. 2. While the waveforms are virtually identical in the absence of an externally applied field, the current between the two polarities is shifted by an amount $I_s$. This shift can place the biasing in the opposite half of the curve by changing the level of Bias Polarity input.

Hawks obtains a zero-compensated output by taking two readings with his magnetometer. One reading is taken on one side of the permeability curve and another reading is taken on the other side of the permeability curve, one reading is subtracted from the other to obtain the final zero-compensated output.

Performance optimization of Hawks' magnetometer is difficult because of the inter-relationship between the DC bias current, maximum drive current, and output frequency arising from the use of an LR oscillator. For example, the maximum drive current can be changed by changing the value of R, however, this also changes the output frequency. (See Equation 6 in column 5 Hawks.) Such a change in output frequency may be unacceptable because, as illustrated in FIG. 4, the permeability of the sensor core is frequency dependent, diminishing as frequency increases. Hawks cannot resolve this problem by changing the inductance of the sensor because that will also modify the DC bias current and maximum drive current. (Again see Equation 6 in column 5 of Hawks).

An additional drawback of the Hawks' frequency-mode magnetometer is its power consumption, which while less than that of a fluxgate magnetometer, is nonetheless less than desirable for battery powered applications because the power required to charge the magnetic sensor is not conserved within the magnetometer.

Thus, a need exists for a low power frequency-mode magnetometer whose operation can be easily optimized to operate in a region of maximum permeability change on the permeability Vs magnetic field curve of the magnetometer's sensor.

SUMMARY OF THE INVENTION

The magnetometer of the present invention offers a number of advantages over those of the prior art. As compared to prior frequency-mode magnetometers, the present magnetometer is easier to operationally optimize, consumes less power, and is inexpensively manufactured.

Briefly described, the present invention is a low power, frequency-mode magnetometer, which includes an LC oscillator, a bias resistor, and a polarity switch. The LC oscillator produces an output signal indicative of both a magnitude and a polarity of a magnetic field. The LC oscillator includes an inverting amplifier and a Pi network including an inductor and two capacitors. The inductor is realized as a coil wound about a high permeability core. The inductor is coupled between an input node and an output node, as is the inverting amplifier. The inverting amplifier has a first trigger voltage and a second trigger voltage, which are symmetrically located with respect to one half of a DC bias voltage. The bias resistor is coupled between the input node of the LC oscillator and a first node, and controls the DC bias current to the inductor. The switch switches the first node between ground and the DC bias voltage.

Other objects, features, and advantages of the present invention will be apparent from the accompanying drawings and detailed description that follows.

BRIEF DESCRIPTION OF THE DRAWINGS

The present invention is illustrated by way of example and not by way of limitation in the figures of the accompanying drawings. In the accompanying drawings, similar references indicate similar elements.

FIG. 1 illustrates a prior frequency-mode magnetometer including a relaxation oscillator.

FIG. 2 illustrates waveforms associated with the prior frequency-mode magnetometer of FIG. 1.

FIG. 3 illustrates the waveforms produced in a null field by the prior frequency-mode magnetometer of FIG. 1.

FIG. 4 is a graph of permeability versus frequency for a high permeability core.

FIG. 5 illustrates the frequency-mode magnetometer of the present invention.

FIG. 6 graphs magnetic flux density versus magnetic field for a high permeability core.

FIG. 7 illustrates the desired operational region of a high permeability core in accordance with the magnetometer of the present invention.

FIG. 8 illustrates a compass including the magnetometer of the present invention.

DETAILED DESCRIPTION

FIG. 5 illustrates frequency-mode magnetometer 10 of the present invention.

Magnetometer 10 permits independent optimization of bias current, maximum drive current, and nominal output frequency. This independence arises from the use of LC resonator 17, rather than an LR resonator. Current levels can be set to desired levels by setting the value of R, then an appropriate operational frequency can be set by selecting appropriate capacitor values, without effecting the current levels. Magnetometer 10 consumes relatively little power because it conserves the energy within the LC resonator, as compared to an LR resonator. This power savings is critical for battery-powered applications, such as digital compasses. Briefly described, in addition to LC resonator 17, magnetometer 10 includes inverting amplifier 19, bias resistor $R_{BIAS}$ and polarity switch 21. The frequency at which LC resonator 17 resonates changes in response to the externally applied magnetic field. To the 180° of phase shift produced at resonance by LC resonator 17, inverting amplifier 19 adds another 180°, producing oscillation. Bias resistor provides bias current to inductor 12, while polarity switch 21 controls which side of the B/H curve magnetometer 10 operates on.

A. Basic Sensor Theory

Prior to a detailed discussion of magnetometer 10, first consider the theory underlying the ability of inductor 12 to function as a magnetic sensor. Inductor 12 includes core 14, about which is wound coil 16. The inductance, L, of inductor 12 is a function of the permeability, $\mu$, of core 14. Permeability is an indication of the ease with which magnetic flux, B, can be driven through magnetic materials. Permeability is defined as magnetic flux, B, divided by the magnetizing force, H, that is required to achieve that flux density. Permeability is expressed by relationship (1).

$$\mu = (\Phi/A)/(NI/L) = B/H; \text{ where} \quad (1)$$

$\Phi$ is the flux through the material;

A is the cross-sectional unit area;

N is the number of turns in a coil would about the material;

I is the current in the coil; and

L is the unit length of the material

The permeability of core materials is usually expressed via a B/H curve. Typically, a B/H curve shows flux density, B, increasing with increasing magnetizing force, H. Once the core reaches the maximum flux density that it can support, beyond which increasing H will not increase B, the core is said to be saturated. This means that until a core reaches saturation, its permeability indicates the strength of magnetic field, H.

As stated previously, the permeability of core 14 affects the inductance of inductor 12, as expressed by relationship (2).

$$L = k_1 N^2 \mu a / l; \text{ where} \quad (2)$$

L is inductance measured in Henrys;

N is the number of turns;

a is the cross-sectional area of the core;

l is the length of the core;

$\mu$ is the permeability of the core material; and $k_l$ is a constant.

Given that a core's permeability varies with magnetic field strength and that inductance is a function of core permeability, then inductance can be used to measure magnetic field strength; in other words, inductor 12 can function as a magnetic sensor.

Core 14 of inductor 12 consists of a saturable, high-permeability material whose transfer characteristic is fairly linear, and which exhibits very low hysteresis. Examples of suitable materials for core 14 include MetGlas™, manufactured by Applied Signal Corporation of Parsippany, N.J.; and Orthonal™, Supermalloy™, and Permalloy™, all manufactured by Magnetics of Butler, Pa. The sensitivity of core 14 can be increased by cutting the saturable, high permeability material, which comes in the form of a tape, longitudinally, rather than transversely, to form the core. Investigation revealed that cutting the core material longitudinally increased its sensitivity to magnetic fields four to five times as compared to its sensitivity when the same core material is cut transversely. The increase in inductor sensitivity makes the LC resonator more sensitive to magnetic fields than previously thought possible.

FIG. 6 illustrates a typical B/H curve 40 for a saturable high-permeability core of a suitable material, such as Met-Glas™. The bell shape of curve 40 is formed by two sides that are mirror images of one another. Each side of curve 40 is divided into three regions 41, 43, and 45 via knees 42 and 44. In regions 41 and 45, the relationship between B and H is very non-linear, while region 43 displays a linear relationship. In the absence of bias current, core 14 oscillates about point 48, which would prevent inductor 12 from indicating the polarity of an externally applied magnetic field in addition to its magnitude. However, by biasing core 14 at a midpoint of regions 43a and 43b, inductor 12 can be used to sense both the strength and the polarity of an external magnetic field.

FIG. 7 illustrates one side of an inductance vs. magnetic field curve 60 for core 14 when biased at point 64 in the null field. (It will be understood that the following discussion applies equally to the other side of the curve, which is not illustrated.) Biasing core 14 at point 64 yields the maximum linear range for inductor 12. At point 64, the applied magnetic field strength is null, indicated via $H_o$. Point 62 represents the maximum negative magnetic field, $H_{NEG}$, that inductor 12 is capable of reliably detecting. Inductance reaches a minimum value, $L_{MIN}$, at point 62. Point 66 represents the maximum positive magnetic field, $H_{POS}$, that inductor 12 is capable of reliably detecting. At point 66 the inductance of inductor 12 reaches maximum value, $L_{MAX}$.

B. Magnetometer Architecture

Referring once again to FIG. 5, magnetometer 10 includes LC oscillator 18, bias resistor $R_{BIAS}$, and polarity switch 21. LC oscillator 18 includes LC resonator 17 and inverting amplifier 19. The resonant frequency of LC resonator 17 changes in response to changes in the inductance of inductor 12, which are in turn caused by changes in the externally applied magnetic field. Changes in the inductance of oscillator 18 cause its output frequency, $f_{out}$, to change. Thus, magnetometer 10 indicates changes in magnetic field strength and polarity via changes in the frequency output, $f_{out}$.

Preferably, LC resonator 17 is realized as a Pi network, which includes inductor 12 and capacitors $C_1$ and $C_2$. Preferably, capacitors C1 and C2 are set to 4700 pF and inductor 12 has a value of 5 mH in a null field, which yields a zero field frequency of approximately 44 kHz. As compared to a relaxation oscillator, LC resonator 17 consumes less power and is better suited for battery-powered applications.

Inverting amplifier 19 provides 180° of phase shift, which combined with 180° provided by LC resonator 17 at resonance cause oscillator to oscillate 18. Inverting amplifier 19 may be realized using any high gain, active amplifier, such as a Schmitt trigger or a comparator for example. The gate used to realize inverting amplifier 19 must have trigger points symmetrically located about Vcc/2. This is so that changing the position of polarity switch 21 will change the direction, but not the magnitude, of the current flowing through inductor 12. For a DC power supply of 5 volts, trigger voltages of 1.06 volts and 3.94 volts are acceptable.

The value of $R_{BIAS}$ sets the bias current to inductor 12 so that magnetometer 10 is capable of detecting both the magnitude and polarity of the externally applied magnetic field. The bias current is equal to the average voltage across $R_{BIAS}$ divided by the resistance of $R_{BIAS}$. The voltage across $R_{BIAS}$ will switch between the high and low trigger voltages of inverting amplifier 19, i.e. ground and Vcc. Thus, the average voltage across $R_{BIAS}$ will be Vcc/2. Given the average voltage across $R_{BIAS}$ and the desired bias point on inductance versus magnetic field curve, the value of $R_{BIAS}$ can be calculated. In one embodiment, $R_{BIAS}$ is set to 820Ω to induce a bias current of 3.048 mA in inductor 12 for a 5 volt DC supply. This is slightly less current than required by Hawks' frequency-mode magnetometer, which includes an LR oscillator.

Polarity switch 21 determines which side of the B/H curve magnetometer 10 operates on. In one switch position magnetometer 10 operates on one side of the B/H curve, and in the other switch position magnetometer 10 operates on the opposite side of the B/H curve. Thus, given the same field in a first switch position, the frequency output by magnetometer 10 will decrease from the null field output frequency while in a second switch position, the output frequency will increase from the null field frequency.

C. Operating the Magnetometer

Temperature typically moves the B/H curve of a magnetometer core, so that the null field bias point changes. Thus, magnetometer 10 requires some temperature compensation to obtain consistent readings across temperature. Characterizing sensor behavior across temperature is possible, but costly and time consuming. Rather than taking this approach, according to the present invention, a zero-compensated, temperature insensitive measurement can be had by taking two readings of opposite polarity. A first reading, D1, is taken with polarity switch 21 in a first position and a second reading, D2, is taken with polarity switch in a second position. Both the sign and magnitude of the external magnetic field can be found by subtracting D2 from D1.

To illustrate, first consider the case when the external field is zero. With polarity switch 21 in the first position, magnetometer 10 outputs a frequency X as D1. With polarity switch 21 in the second position, magnetometer 10 also outputs frequency X as D2. Subtracting D2 from D1, we obtain a value of zero for the magnetic field. Consider now the situation when there is an external field that produces a frequency of +1000 Hz in the first switch position and a frequency of −1000 Hz in the second switch position. Subtracting D2 from D1 indicates a field of magnetic of +2000. This indicates both the polarity and magnitude of the magnetic field. (This reading is not an absolute measure of magnetic field strength but is adequate for ratiometric determination of compass heading.) Finally, consider the situation when there is an external field that produces a frequency reading of −1000 Hz for D1 and +1000 Hz for D2. These readings indicate a magnetic field strength of −2000.

D. Compass Systems

FIG. 8 illustrates battery powered compass 80, which utilizes two magnetometers 10. Counter 82 accepts the signal output by each magnetometer 10, $f_{out}$, and communicates the frequency of $f_{out}$ to microprocessor 84. Microprocessor 84 causes counter 82 to take two readings of $f_{out}$, D1 and D2, by controlling the position of polarity switch 21. Given D1 and D2 microprocessor 84 has an indication of the strength and polarity of the external magnetic field along two axes, which it uses to calculate a heading. Microprocessor 84 outputs the heading to display 86.

With prior magnetometers, the magnetic sensors of each compass axis had to be gain matched to insure that each axis reacted in the same manner to the same external magnetic field. Magnetometer 10 eliminates the need to gain match each of magnetic sensors via gain matching coefficients. A gain matching coefficient can be obtained for each magnetic sensor by calculating gain constants for each axis' magnetic sensor. A magnetic sensor's gain constant can be determined by adding the absolute values of the two null field polarity measurements. The gain constant of a magnetic sensor is expressed by relationship (3).

$$C=|D1|+|D2|; \quad (3)$$

where:

C is the gain constant;

D1 is the magnetometer output for a null field when the polarity switch is in a first position; and D2 is the magnetometer output for a null field when the polarity switch is in a second position.

Given the symmetry of the B/H curve, relationship (3) can be assumed to hold for all values of H, as long as the sensor operates in a linear region. So in a compass with two sensors of the same material, both sensors should have the same transfer characteristics even if their resonant frequencies are slightly different due to slight differences in capacitor and inductor values of each LC resonator. This allows the value of C from relationship (3) to be used to determine the gain differences between the two sensors of a compass.

In the foregoing specification, the invention has been described with reference to specific exemplary embodiments thereof. It will, however, be evident that various modifications and changes may be made thereto without departing from the broader spirit and scope of the invention as set forth in the appended claims. Accordingly, the specification and drawings are to be regarded in an illustrative rather than a restrictive sense.

What is claimed is:

1. A magnetometer comprising: an inverting amplifier, an inductor having an inductance that varies with magnetic field strength connected between the input and the output of the inverting amplifier, and a pair of capacitors connected to the inductor in a Pi configuration, with the inverting amplifier, the inductor and the capacitors forming an oscillator which operates at a frequency determined by the strength of a magnetic field to which the inductor is subjected.

2. The magnetometer of claim 1 wherein the inductor has a core with a permeability that varies with magnetic field strength.

3. The magnetometer of claim 1 wherein the inductor has a core of high permeability, low hysteresis material.

4. The magnetometer of claim 1 wherein the inverting amplifier comprises a Schmitt trigger.

5. The magnetometer of claim 1 wherein the inverting amplifier comprises a comparator.

6. A magnetometer comprising: an LC oscillator having an inductor that varies in inductance with magnetic field strength, a capacitance connected electrically in parallel with the inductor to form a parallel resonant circuit, and an amplifier to which the parallel resonant circuit is connected as a frequency determining element so that the oscillator operates at a frequency that varies with the strength of a magnetic field to which the inductor is subjected.

7. The magnetometer of claim 6 wherein the inductor has a core with a permeability that varies with magnetic field strength.

8. The magnetometer of claim 6 wherein the inductor has a core of high permeability, low hysteresis material.

9. The magnetometer of claim 6 wherein the capacitance comprises a pair of capacitors which are connected to opposite ends of the inductor and to a common node to form a pi network with the inductor.

10. The magnetometer of claim 6 including a voltage source Vcc for biasing the amplifier, and the amplifier has a pair of trigger voltages at levels which are symmetrical to Vcc/2.

11. A magnetometer comprising: an inverting amplifier, an inductor having an inductance that varies with magnetic field strength connected between the input and the output of the inverting amplifier, a biasing resistor switchably connected between the input of the inverting amplifier and first and second bias voltage levels, a first capacitor connected between the input of the inverting amplifier and the first bias voltage level, and a second capacitor connected between the output of the inverting amplifier and the first bias voltage level.

12. The magnetometer of claim 11 wherein the inductor has a core with a permeability that varies with magnetic field strength.

13. The magnetometer of claim 11 wherein the inductor has a core of high permeability, low hysteresis material.

14. The magnetometer of claim 11 wherein the inverting amplifier comprises a Schmitt trigger.

15. The magnetometer of claim 11 wherein the inverting amplifier comprises a comparator.

16. The magnetometer of claim 11 wherein the inverting amplifier has first and second trigger voltages which are symmetrical to the bias voltage levels.

17. A magnetometer comprising: an LC oscillator having an frequency determining inductor that varies in inductance with magnetic field strength and a core of permeable material with a bell-shaped B/H curve that has a substantially linear region on each side of the B-axis, and means for selectively biasing the core for operation in either one of the linear regions so that the output of the oscillator will indicate the strength and polarity of either a positive magnetic field or a negative magnetic field depending upon the region to which the core is biased.

18. The magnetometer of claim 17 wherein the means for biasing the core comprises a voltage source having a first output at zero volts and a second output at a voltage Vcc, and a switch for selectively connecting either the first output or the second output to the inductor.

* * * * *